United States Patent
Rebholz-Goldmann et al.

(10) Patent No.: US 10,953,862 B2
(45) Date of Patent: Mar. 23, 2021

(54) METHOD FOR OPERATING A PARKING BRAKE AND CONTROL DEVICE FOR OPERATING A PARKING BRAKE

(71) Applicant: Robert Bosch GmbH, Stuttgart (DE)

(72) Inventors: Peter Rebholz-Goldmann, Yokohama (JP); Toni Frenzel, Heilbronn (DE)

(73) Assignee: Robert Bosch GmbH, Stuttgart (DE)

( * ) Notice: Subject to any disclaimer, the term of this patent is extended or adjusted under 35 U.S.C. 154(b) by 359 days.

(21) Appl. No.: 15/973,968

(22) Filed: May 8, 2018

(65) Prior Publication Data

US 2018/0345947 A1   Dec. 6, 2018

(30) Foreign Application Priority Data

Jun. 1, 2017   (DE) ..................... 10 2017 209 319.6

(51) Int. Cl.
| | | |
|---|---|---|
| *B60T 17/22* | (2006.01) | |
| *B60T 7/02* | (2006.01) | |
| *G01R 19/10* | (2006.01) | |
| *G01R 19/165* | (2006.01) | |
| *B60T 13/74* | (2006.01) | |

(52) U.S. Cl.
CPC ............. *B60T 17/221* (2013.01); *B60T 7/02* (2013.01); *B60T 13/741* (2013.01); *B60T 13/748* (2013.01); *G01R 19/10* (2013.01); *G01R 19/16576* (2013.01)

(58) Field of Classification Search
CPC ........ B60T 17/221; B60T 13/748; B60T 7/02; B60T 13/741; B60T 8/885; B60T 13/74; B60T 17/22; B60T 2270/402; G01R 19/10; G01R 19/16576
USPC .......................................................... 701/70
See application file for complete search history.

(56) References Cited

U.S. PATENT DOCUMENTS

| | | | | |
|---|---|---|---|---|
| 2006/0225985 A1* | 10/2006 | Dimig | .................... | B60R 25/08 192/84.1 |
| 2013/0021155 A1* | 1/2013 | Gandara | ................ | G08B 29/06 340/540 |
| 2014/0149012 A1* | 5/2014 | Shiraki | ................. | B60T 13/741 701/70 |

FOREIGN PATENT DOCUMENTS

DE    10 2014 204 287 A1    9/2015

\* cited by examiner

*Primary Examiner* — Muhammad Shafi
(74) *Attorney, Agent, or Firm* — Maginot, Moore & Beck LLP

(57) ABSTRACT

A method for operating an electric parking brake includes feeding a timing sequence of changes in current to terminals of an interface for an operator control element for the parking brake. The method further includes performing at least one current measurement at at least one terminal of the interface during the feeding of one of the changes in current. The method further includes determining a driver's request as a function of the at least one current measurement. The method further includes operating the electric parking brake as a function of the determined driver's request.

11 Claims, 7 Drawing Sheets

US 10,953,862 B2

METHOD FOR OPERATING A PARKING BRAKE AND CONTROL DEVICE FOR OPERATING A PARKING BRAKE

This application claims priority under 35 U.S.C. § 119 to patent application no. DE 10 2017 209 319.6 filed on Jun. 1, 2017 in Germany, the disclosure of which is incorporated herein by reference in its entirety.

The disclosure relates to a method for operating a parking brake and to a control device for operating the parking brake.

BACKGROUND

DE 10 2014 204 287 A1 discloses a method for operating a motor vehicle brake device which has at least one electronic parking brake with at least one actuator, wherein when a first switching signal is applied to a switching signal input the actuator is actuated in order to activate the parking brake. It is proposed that the switching signal input be enabled in a normal operating mode to apply any desired switching signals and be fixedly set, in a safety operating mode, to a second switching signal which is different from the first switching signal, with the result that the actuation of the actuator for activating the parking brake is prevented.

SUMMARY

The problem on which the disclosure is based is solved by a method and by a control device according to the disclosure.

It is proposed that a timing sequence of changes in current be fed to terminals of an interface for an operator control element for the parking brake. During the feeding of one of the changes in current at least one current measurement is carried out at at least one terminal of the interface. The driver's request is determined as a function of the at least one current measurement. The electric parking brake is operated as a function of the current measurements.

The driver's request is reliably detected at the operator control element in the proposed manner, i.e. the feeding of changes in current and current measurements. The feeding of changes in current causes the associated signal levels to be reduced, and therefore the electromagnetic interference in the vehicle is also decreased.

In one advantageous embodiment, a state of the operator control element is determined by an input unit. An actuator command in a normal operating mode of the parking brake is determined as a function of the state, by a control unit which is different from the input unit. The input unit advantageously permits adaptation to functionally different operator control units. The input unit is correspondingly configured for this purpose. This results in functional decoupling of the control unit from the input unit.

One advantageous embodiment is defined by the fact that the timing sequence of changes in current is a timing sequence of individual current pulses. This advantageously reduces the power consumption.

One advantageous embodiment is defined by the fact that the timing sequence of changes in current and the current measurements are repeated after the expiry of a cycle time period. As a result, the power loss can be reduced, since currentless switching of the line between the operator control element and the interface is temporarily made possible if a current measurement does not take place.

One advantageous embodiment is defined by the fact that a signal level is fed to a further terminal of the terminals, wherein another of the terminals of the interface is monitored for the reception or the interruption of the signal level, and wherein the timing sequence of changes in current and the current measurements is started as a function of the reception or the interruption of the signal level. As a result, the operator control element triggers its own reading out process by means of the abovementioned changes in current and current measurements.

One advantageous embodiment is defined by the fact that the determined current measurements are compared with predetermined setpoint measurements, and wherein a valid state of the operator control element is determined if the determined current measurements correspond to the predetermined setpoint measurements. It is therefore easily possible to determine the state of the operator control element. Simple adaptation to various types of operator control element is possible by means of pre-configured setpoint measurements.

One advantageous embodiment is defined by the fact that a fault is determined if the determined current measurements do not correspond to the predetermined setpoint measurements. It is therefore possible to carry out simple determination of a fault.

One advantageous embodiment is defined by the fact that the feeding of the timing sequence of changes in current comprises:
  that a first change in current is fed to a first terminal of the interface within a first time period,
  in that during the first time period a first current measurement takes place at another terminal than the first terminal of the interface,
  in that a second change in current is fed to a second terminal of the interface within a second time period, and
  in that during the second time period a second current measurement takes place at another terminal than the second terminal of the interface.

One advantageous embodiment is defined by the fact that a voltage level which is present at a terminal of the interface is compared with a reference voltage level, in particular with a supply voltage level or a ground voltage level, and wherein a fault is determined if the reference voltage level is reached.

BRIEF DESCRIPTION OF THE DRAWINGS

Further advantageous advantages and features of the disclosure can also be found in the following description and in the drawing. In the drawing.

DETAILED DESCRIPTION

Figure 1:
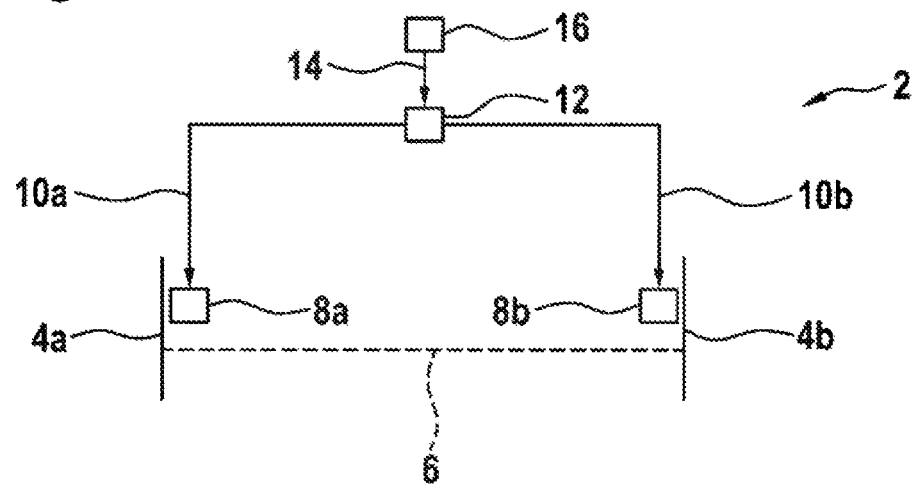
FIGS. 1, 3, 4 and 8 show a parking brake of a motor vehicle in a schematic form.

FIG. 1 shows a parking brake 2 of a motor vehicle in a schematic form. The parking brake 2 serves to continuously interlock the wheels 4a, 4b of a vehicle axle 6 of a motor vehicle and comprises a respective actuator 8a, 8b for this purpose. Control signals 10a and 10b are fed to the actuators 8a and 8b from a control device 12. The control device 12 determines the control signals 10a and 10b as a function of a state 14 of an operator control element 16. The operator control element 16 is arranged so as to be accessible to the vehicle driver. The state 14 of the operator control element 16 determines the actuation of the actuators 8a and 8b. Opening the parking brake 2 comprises enabling rotation of the wheels 4a and 4b. Closing of the parking brake 2 comprises locking the wheels 4a and 4b.

Figure 2:
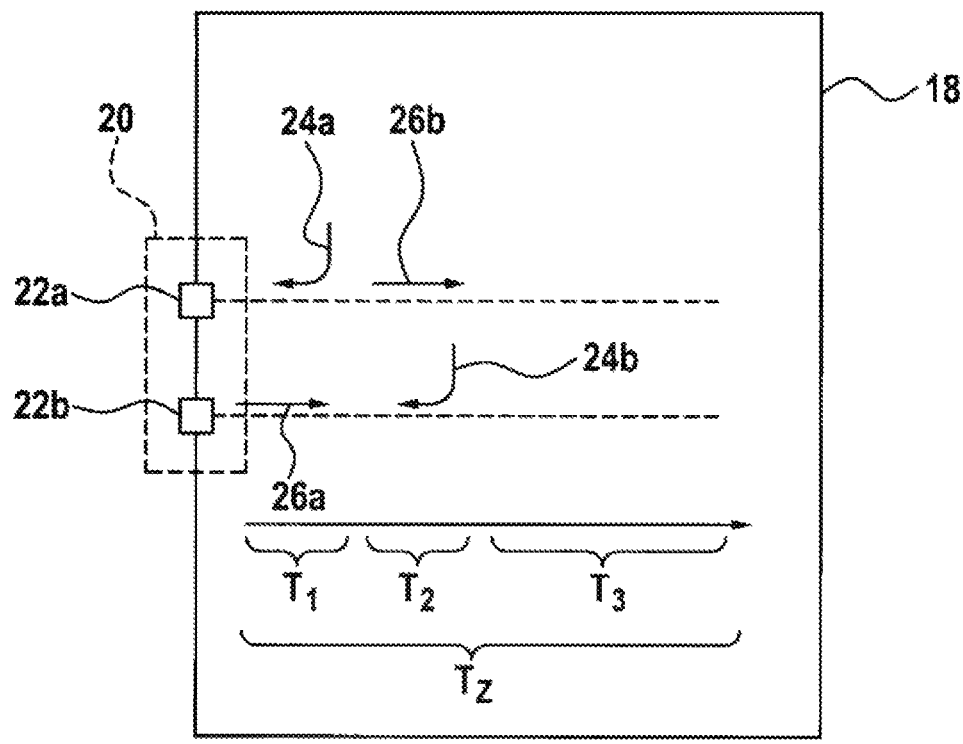
FIG. 2 shows an input unit of a control device in a schematic form.

FIG. 2 shows an input unit 18 of the control device 12 in a schematic form and serves to explain a method for operating the parking brake 2. The input unit 18 comprises an interface 20 for the operator control element 16. During a first time period T1 a change in current 24a is fed to a terminal 22a of the interface 20. During the feeding of the change in current 24a a current measurement 26a is carried out at a further terminal 22b. During a second time period T2 a change in current 24b is fed to the terminal 22b of the interface 20. During the feeding of the change in current 24b, a current measurement 26b is carried out at the terminal 22a. Therefore, a time sequence of changes in current 24a, 24b is fed to terminals 22a, 22b of the interface 20, and during the feeding of the respective change in current 24a, 24b at least one current measurement 26a, 26b is carried out at at least one terminal 22b, 22a. The electric parking brake 2 is operated, i.e. opened or closed, as a function of the current measurements 26a and 26b. For this purpose, a driver's request, which the driver specifies by means of the operator control element, is determined as a function of the current measurements 26a and 26b. Subsequently, the electric parking brake 2 is operated as a function of the driver's request.

The changes in current 24a and 24b comprise a change in the fed current from a first current level to a second current level. As an alternative to this, a change in current comprises an individual current pulse, wherein the current rises here from a current level and then returns to this current level in the sense of an individual current pulse. Of course, the proposed method is not limited to a number of two terminals 22a and 22b but rather usually comprises at least a number of four or six terminals 22.

During a further time period T3 changes in current are not fed to the interface 20. After a cycle time Tz the timing sequence of changes in current 24a and 24b and the associated current measurements 26a and 26b are repeated. The cycle time Tz varies in a range from 50 ms to 130 ms, in particular 90 ms. Of course, as an alternative to the cyclical execution of the changes in current 24a, 24b, a triggered execution can be carried out, wherein in this context the operator control element 16 is monitored for a change in state.

Figure 3:
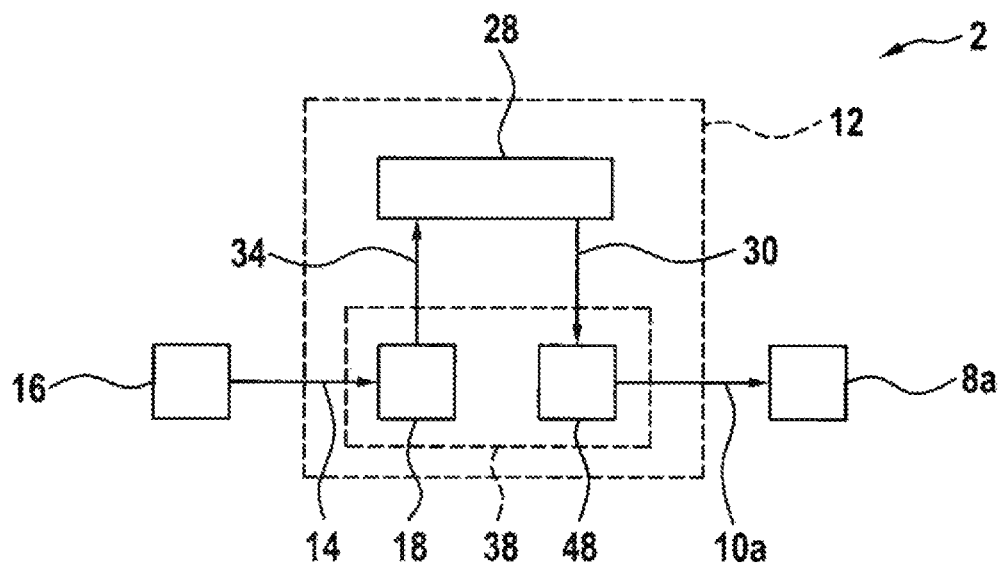

FIG. 3 shows a schematic block diagram of the parking brake 2 in a normal operating mode. The control device 12 comprises a first control unit 28 which is embodied, for example, as a microcontroller, and a second control unit 38. The second control unit 38 is preferably implemented as an application-specific integrated circuit, abbreviated as ASIC, but can, of course, also be embodied as a microcontroller. The second control unit 38 comprises the input unit 18 and an output unit 48. In the normal operating mode the input unit 18 determines the state 14 of the operator control element 16 and transmits it in the form of a state 34 to the first control unit 28. The state 34 corresponds to a determined driver's request which the driver specifies by means of the operator control element 16. The second control unit 38 and, in particular, the input unit 18 are pre-configured for various types of operator control element 16 and can therefore be used in a multiplicity of different operator control elements 16. The output unit 48 determines, as a function of an actuator command 30, at least one of the control signals 10a, 10b and feeds this at least one control signal 10a, 10b to the respective actuator 8a or 8b.

Figure 4:
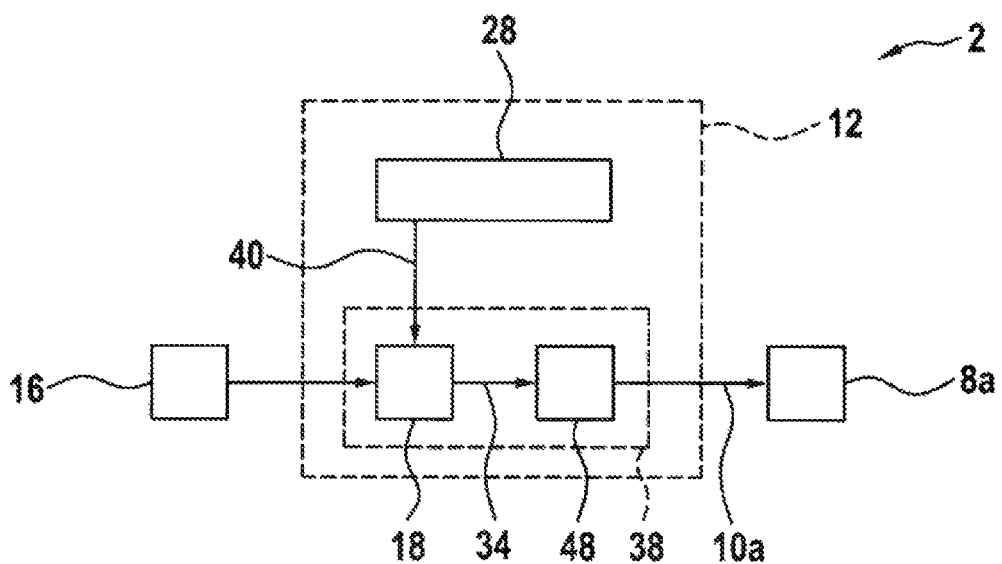

FIG. 4 shows a schematic block diagram of the parking brake 2 in an emergency operating mode. A fault 40 is determined with respect to the first control unit 28. The parking brake 2 and, in particular, the second control unit 38 go into an emergency operating mode as a function of the determined fault 40. In the emergency operating mode the input unit 18 determines the state 34 for the operator control element 16 and transmits it directly to the output unit 48. The output unit 48 determines at least one of the control signals 10a, 10b as a function of the state 34. Therefore, the second control unit 38 operates the parking brake 2 in the emergency operating mode as a function of the determined state 34 of the operator control element 16.

Figure 5:
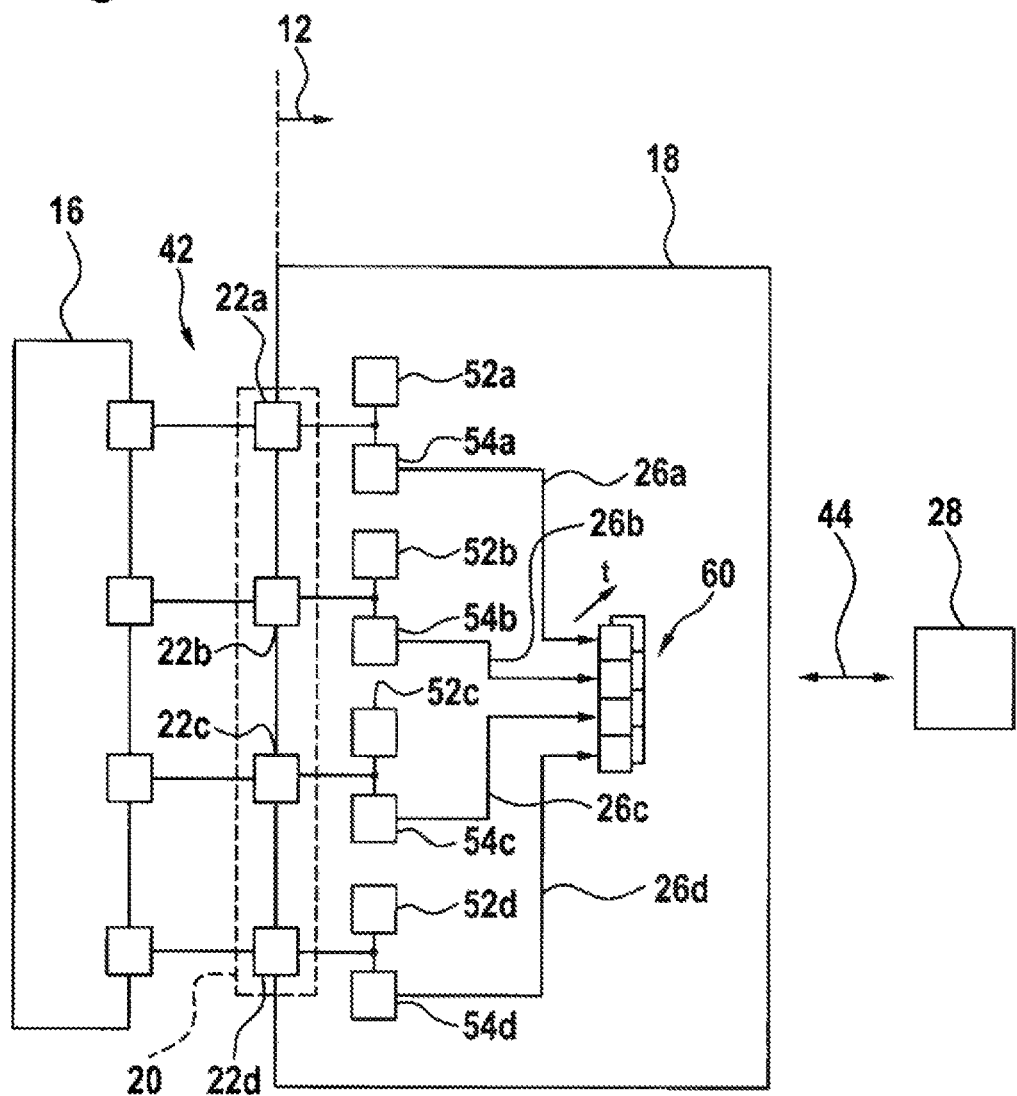
FIGS. 5 and 7 show a schematic block diagram of an operator control element, an input unit and a first control unit.

FIG. 5 shows a schematic block diagram with the operator control element 16, the input unit 18 and the first control unit 28. The operator control element 16 is connected to the interface 20 of the input unit 18 via a cable-bound line 42. The input unit 18 is connected to the first control unit 28 via a bus system 44, in particular an SPI (Serial Peripheral Interface) bus. Each individual terminal of the terminals 22a to 22d of the interface 20 is connected to a respective switchable power source 52a to 52d and to a respective current measuring element 54a to 54d. The power sources 52a to 52d are actuated in such a way that a timing sequence of changes in current 24 is fed to the terminals 22a to 22d. During this feeding of changes in current 24, the respective current measurement 26a to 26d is carried out by means of the current measuring elements 54a to 54d. These current measurements 26a to 26d are present as bit information. A bit pattern 60 is determined in this way in response to feeding of a change in current 24. A sequence of bit patterns 60 is determined in response to the number of changes in current 24. The bit patterns 60 are then available to the control unit 28 for evaluation. The driver's request is determined in the sense of "close parking brake" or "open parking brake" as a function of the bit patterns 60.

Figure 6:
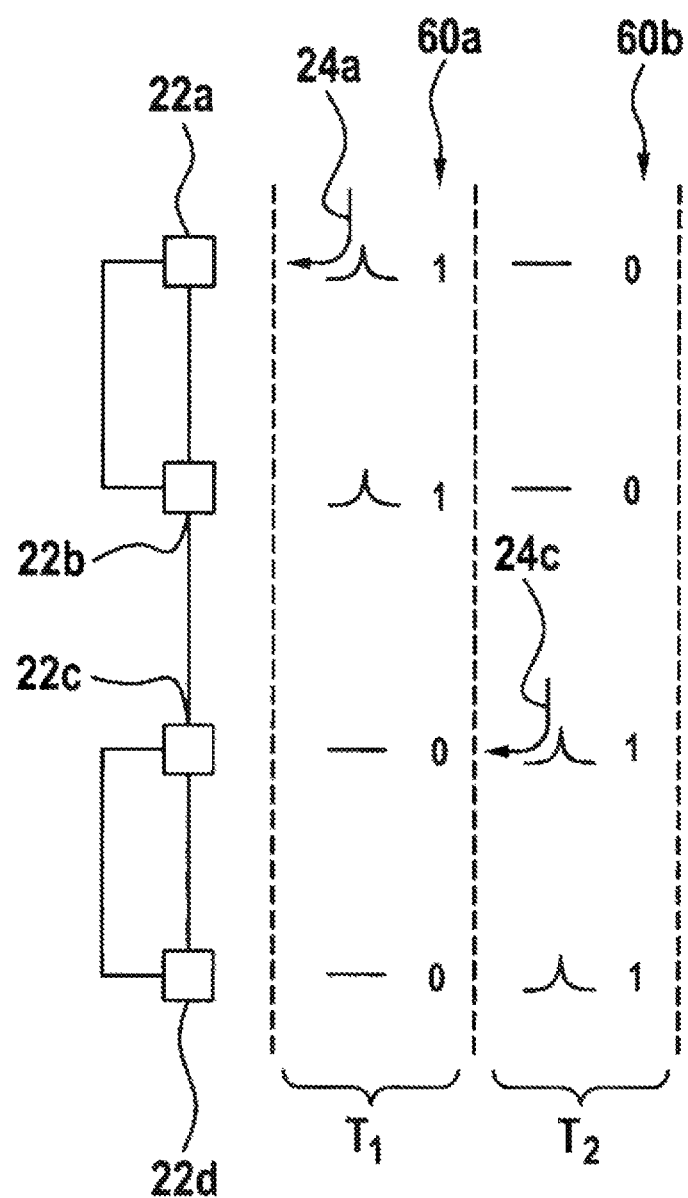
FIG. 6 shows a schematic sequence of changes in current.

FIG. 6 shows a schematic sequence of changes in current 24. For example, the operator control element 16 connects the terminals 22a and 22b and the terminals 22c and 22d in an electrically conductive fashion. During the first time period T1, a change in current in the form of a current pulse is fed to the terminal 22a, which can be detected during a current measurement at the terminal 22b on the basis of the electrically conductive connection between the two terminals 22a and 22b. Correspondingly, a first bit pattern 60a is obtained. A second bit pattern 60b is obtained in the second time period T2 in an analogous form.

Figure 7:
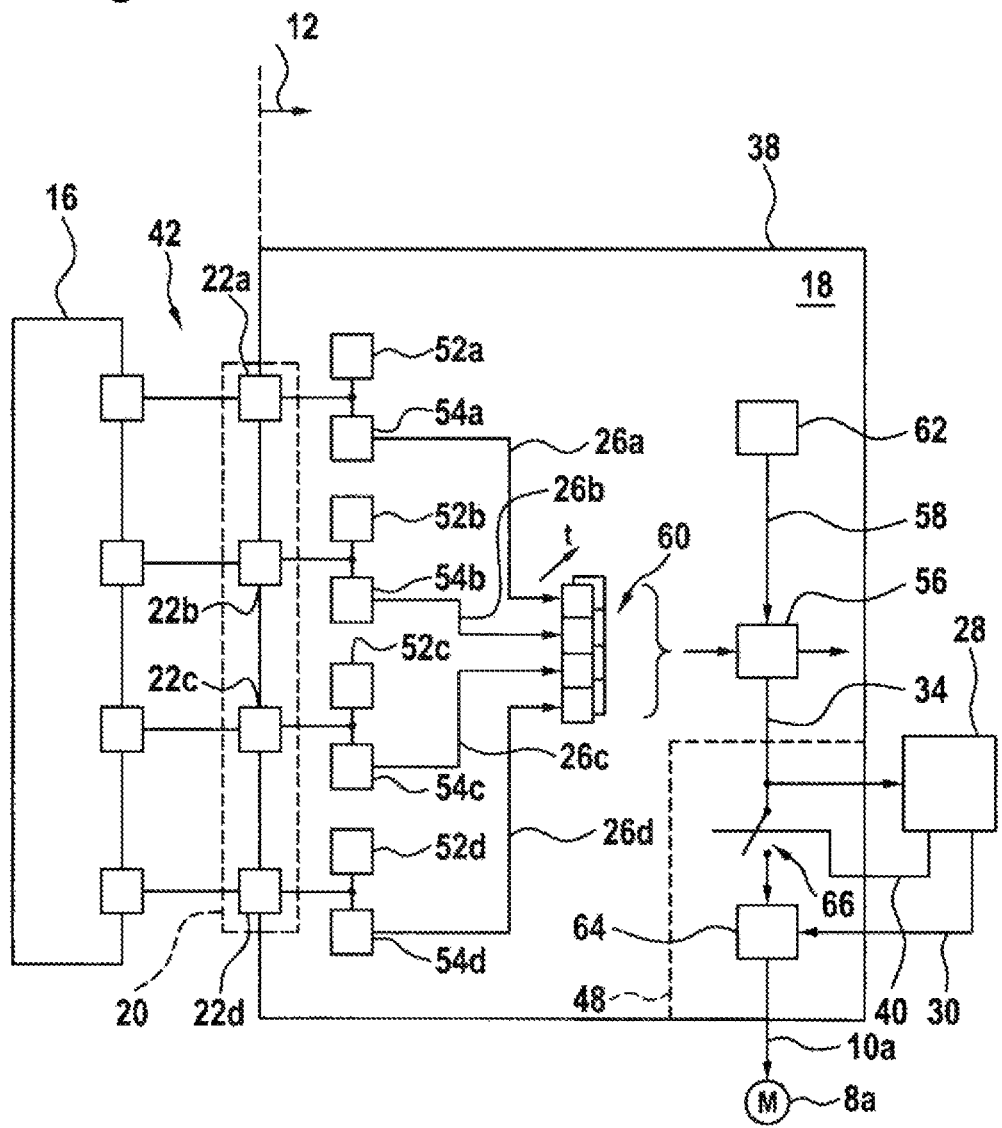

FIG. 7 shows a schematic block diagram by analogy with FIG. 5. In contrast to FIG. 5 the input unit 18 comprises a comparator unit 56 which compares the current measurements 26a to 26d in the form of the present bit pattern 60 with setpoint measurements 58 which are stored in a memory element 62. If the determined current measurements 26 correspond to setpoint measurements 58, a permissible to valid state 34 of the operator control element 16 is determined. If the current measurements 26 do not correspond to setpoint measurements 58 for a permissible state 34, a fault state is determined. The comparator unit 56 therefore determines the state 34 as a function of the comparison, and makes available said state to the first control unit 28.

As a function of the state 34, the first control unit 28 in the normal operating mode determines an actuator command 30 which is fed to an output stage unit 64. The output stage unit 64 determines the control signal 10*a*.

In addition to the feeding of changes in current and the simultaneous measurement, a constant signal level can be fed to one of the terminals 22*a* to 22*d*, wherein continuous monitoring is carried out at another of the terminals 22*a* to 22*d*. The continuous monitoring of this terminal comprises detecting reception or interruption of the signal level. The timing sequence of changes in current 24 and current measurements 26 is started as a function of the reception or the interruption of the signal level. This can take place in addition to or as an alternative to the cyclical repeating of the timing sequence of changes in current 24.

If the first control unit 28 signals the fault 40, the output unit 48 closes a switch 66 and passes on the state 34 directly to the output stage unit 64. Of course, the fault 40 can also be determined in some other way.

Figure 8:
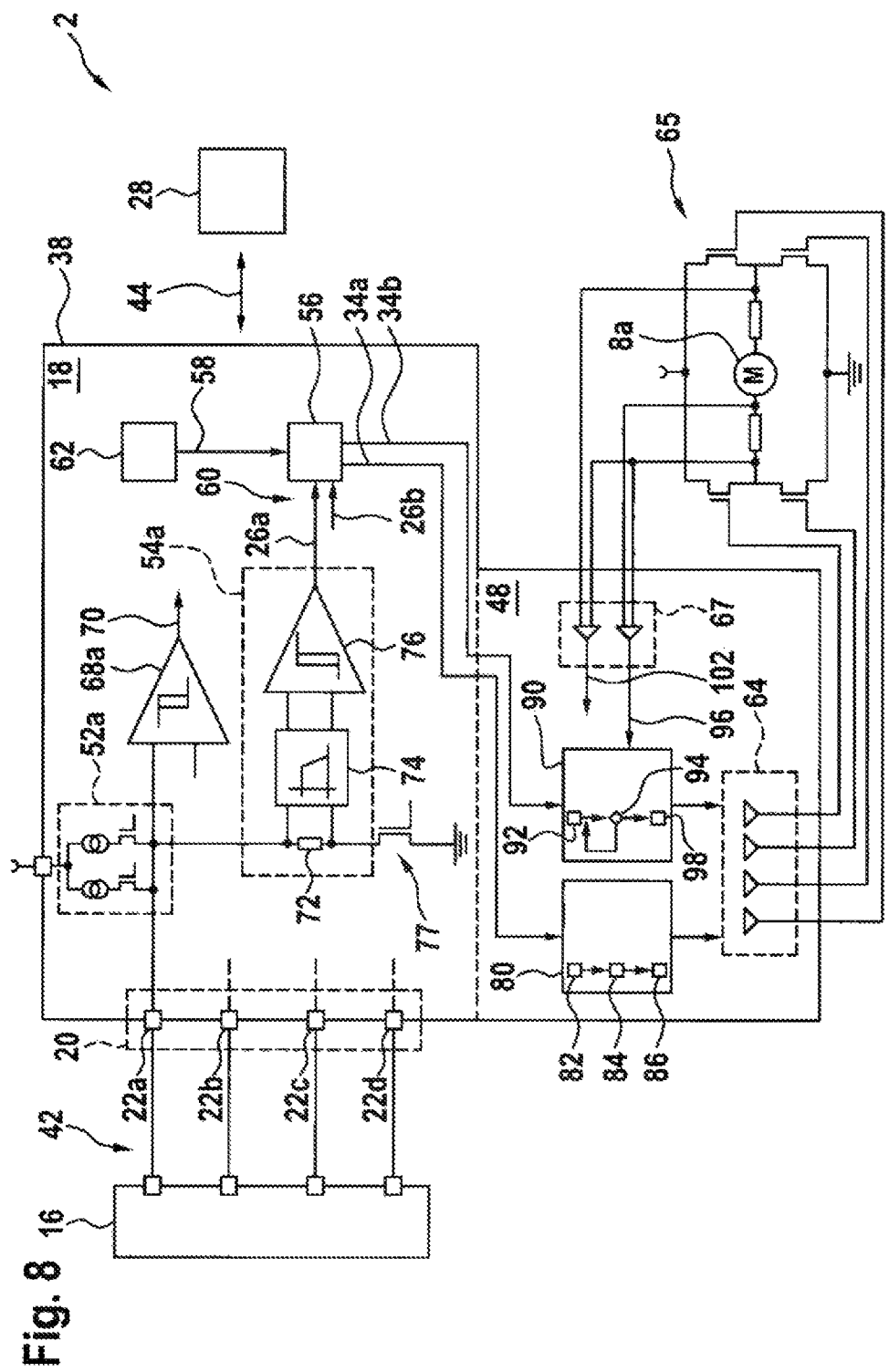

FIG. 8 shows a schematic block diagram of the parking brake 2. The switchable power source 52*a* and the current-measuring element 54*a* are connected to the terminal 22*a*, which is illustrated by way of example. The switchable power source 52*a* comprises two power sources which are arranged in parallel and can be connected and disconnected. A comparator unit 68*a* compares the voltage level at the terminal 22*a* with a voltage supply level or a ground level and therefore determines a short-circuit signal 70 for the purpose of diagnosis and switching off. The current measurement-element 54*a* comprises a measuring shunt 72, a low-pass element 74 and a comparator 76 which makes available the current measurement 26*a* in bit form. Between the ground and the current-measuring element 54*a* there is a current limiter 77. The output stage element 64 comprises a number of output stages which are designed to switch individual switches of power electronics 65 for the actuator 18*a*. A measurement element 67 serves to determine an actuator current 96 which flows through the actuator 18*a*, in particular an electric motor, to determine an actuator voltage 102 which drops across a region of the circuit comprising the actuator 18*a*.

If the comparator unit 56 determines, as a function of the fed bit pattern 60, a state 34*a* of the operator control element 16 which constitutes an opening command for the parking brake 2, the output stage unit 64 is operated in the emergency operating mode according to a sequence 80. This sequence 80 comprises, in a first step 82, operating the actuator 8*a* to open the parking brake 2. In a second step 84, the sequence 80 waits for a time period until a time threshold value is reached. In a third step 86 the actuator 18*a* is switched off. The parking brake 2 therefore enables rotation of the wheels 4.

If the comparator unit 56 determines, as a function of the fed bit pattern 60, a state 34*b* of the operator control element 16 which constitutes a closing command for the parking brake 2, the output stage unit 64 is operated in the emergency operating mode according to a sequence 90. The sequence 90 comprises, in a first step 92, the operation of the actuator 8*a* to close the parking brake 2. In a second step 94 the actuator current 96 is monitored. If the actuator current 96 exceeds a predetermined threshold value for a predetermined minimum time period of, for example, 30 ms, in a step 98 the actuator 8*a* is switched off. The parking brake 2 is therefore closed and interlocks the wheels 4.

The emergency operating mode illustrated in FIG. 8 differs from the normal operating mode to the effect that in the normal operating mode the first control unit 28 operates the output stage unit 64 as a function of the actuator voltage 102, the actuator current 96 and the state 34 of the operator control element 16. The actuator voltage 102, the actuator current 96 and the state 34 of the operator control element 16 are available to the first control unit 28 via the bus system 44.

Figure 9:
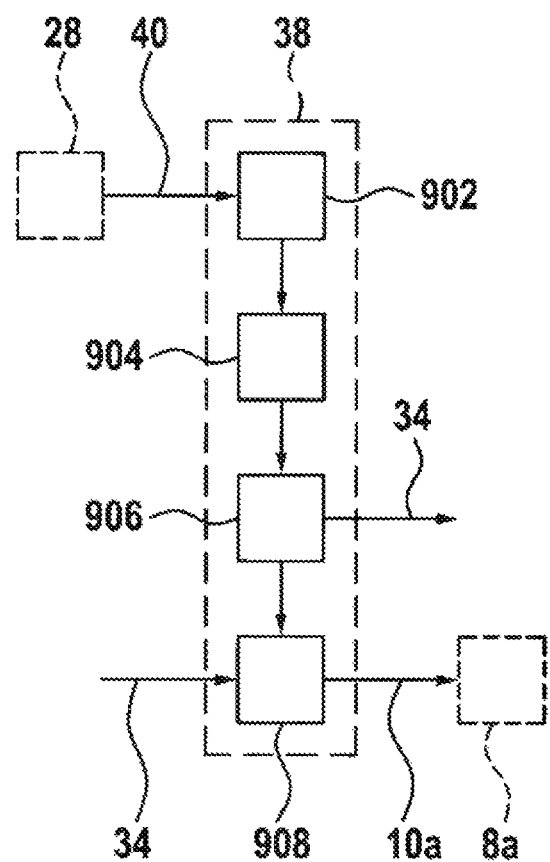
FIG. 9 shows a schematic flowchart.

FIG. 9 shows an exemplary flowchart for operating the second control unit 38. A fault 40 is determined with respect to the first control unit 28. This means that within the second control unit 38 it is detected that the first control unit 28 is no longer suitable for operating the parking brake 2, or that this fault 40 is fed to the second control unit 38, i.e. the second control unit 38 receives, in a step 902, and therefore determines said fault 40. Consequently, the determination of the fault 40 can take place in different ways. For example, the first control unit 28 itself monitors and communicates the fault 40 to the second control unit 38. The second control unit 38 receives the fault 40 in the step 902. In a further example, the first control unit 28 is monitored by a monitoring unit such as, for example, a watchdog, and the monitoring unit checks for example with an enquiry-response schema, the functional capacity of the first control unit 28. The monitoring unit is, for example, integrated in the second control unit 38.

If the fault 40 is present in the second control unit 38, a second control unit 38 is transferred, in a step 904, into the emergency operating mode and is operated therein. In the emergency operating mode, the second control unit 38 determines, in a step 906, the state 34 for the operator control element of the parking brake, wherein the state 34 corresponds to the driver's request to operate the parking brake. In a step 908, the second control unit 38 operates the actuator 8*a* with the control signal 10*a* as a function of the state 34 of the operator control element 16. Correspondingly, even in the event of a failure of the first control unit 28, which operates the actuator 8*a* in a normal operating mode, an emergency operating mode is made available by means of which the second control unit 38 can operate the actuator 8*a* with a reduced functional scope. The functional scope which is made available by the first control unit 28 in the normal operating mode comprises, for example, precise evaluation of the signals of the power electronics and outputting of control signals 10 which is correspondingly finely adjusted thereto, while the reduced functional scope which is made available by the second control unit 38 in the emergency operating mode makes available a less precise evaluation of the signals of the power electronics and correspondingly only basic functions of the parking brake 2 with control signals 10. For electric vehicles which do not have a transmission interlock, this constitutes an improvement, since the proposed increasing of the availability of the parking brake ensures a stopping capability of the vehicle. Of course, the increased availability is also advantageous in vehicles comprising a transmission interlock.

What is claimed is:

1. A method for operating an electric parking brake, comprising:
   feeding, with a control device, a timing sequence of changes in current to terminals of an interface for an operator control element for the parking brake;
   performing, with the control device, at least one current measurement at a first set of terminals of the interface during the feeding of one of the changes in current;
   determining, with the control device, a driver's request as a function of the at least one current measurement; and
   operating the electric parking brake as a function of the determined driver's request.

2. The method according to claim 1, further comprising:
determining a state of the operator control element by an input unit of the control device; and
determining an actuator command in a normal operating mode of the parking brake as a function of the state by a control unit of the control device, the control unit different from the input unit.

3. The method according to claim 1, wherein the timing sequence of the changes in current is a timing sequence of individual current pulses.

4. The method according to claim 1, wherein the timing sequence of changes in current and the at least one current measurement are repeated after an expiry of a cycle time period.

5. The method according to claim 1, further comprising:
feeding, with the control device, a signal level to a second set of the terminals of the interface;
monitoring, with the control device, a third set of the terminals of the interface for reception or interruption of the signal level; and
starting the timing sequence of changes in current and the at least one current measurement as a function of the reception or the interruption of the signal level.

6. The method according to claim 1, further comprising:
comparing, with a control device, the at least one current measurement with predetermined setpoint measurements; and
determining, with the control device, a valid state of the operator control element if the at least one current measurement corresponds to the predetermined setpoint measurements.

7. The method according to claim 6, further comprising:
determining, with the control device, a fault if the at least one current measurement does not correspond to the predetermined setpoint measurements.

8. The method according to claim 1, wherein the feeding of the timing sequence of changes in current includes:
feeding, with the control device, a first change in current to a first terminal of the interface within a first time period;
performing, with the control device, a first current measurement at another terminal than the first terminal of the interface during the first time period;
feeding, with the control device, a second change in current to a second terminal of the interface within a second time period; and
performing, with the control device, a second current measurement at another terminal than the second terminal of the interface during the second time period.

9. The method according to claim 1, further comprising:
comparing, with a control device, a voltage level present at a terminal of the interface with a reference voltage level; and
determining, with the control device, a fault if the reference voltage level is reached.

10. The method according to claim 9, wherein the reference voltage level is a supply voltage level or a ground voltage level.

11. A control device for operating a parking brake, comprising:
a first control unit; and
a second control unit including an input unit and an output unit, the input unit having an interface for an operator control element and the interface having one or more terminals,
wherein the second control unit is configured to:
feed a timing sequence of changes in current to the one or more terminals of the interface for the operator control element for the parking brake;
perform at least one current measurement at a first set of terminals of the interface during the feeding of one of the changes in current;
determine a driver's request as a function of the at least one current measurement; and
operate the electric parking brake as a function of the determined driver's request.

* * * * *